(12) United States Patent
Hayden

(10) Patent No.: US 8,804,451 B2
(45) Date of Patent: *Aug. 12, 2014

(54) POWER SOURCE AND POWER SOURCE CONTROL CIRCUIT

(71) Applicant: Micron Technology, Inc., Boise, ID (US)

(72) Inventor: Douglas Todd Hayden, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/971,643

(22) Filed: Aug. 20, 2013

(65) Prior Publication Data

US 2013/0334885 A1    Dec. 19, 2013

Related U.S. Application Data

(63) Continuation of application No. 13/619,536, filed on Sep. 14, 2012, now Pat. No. 8,514,649, which is a continuation of application No. 12/816,878, filed on Jun. 16, 2010, now Pat. No. 8,289,799.

(51) Int. Cl.
*G11C 5/14* (2006.01)

(52) U.S. Cl.
USPC ............ 365/226; 365/227; 365/242; 365/243

(58) Field of Classification Search
USPC .................................. 365/226, 227.242, 243
See application file for complete search history.

(56) References Cited

U.S. PATENT DOCUMENTS

| | | | |
|---|---|---|---|
| 4,645,943 A | | 2/1987 | Smith, Jr. et al. |
| 4,730,121 A | * | 3/1988 | Lee et al. ........................ 307/66 |
| 7,888,816 B2 | | 2/2011 | Zajkowski |
| 2001/0005124 A1 | | 6/2001 | Odeohhara et al. |
| 2002/0039034 A1 | | 4/2002 | Kohda |

* cited by examiner

*Primary Examiner* — Fernando Hidalgo
(74) *Attorney, Agent, or Firm* — Dorsey & Whitney LLP

(57) ABSTRACT

Power sources, backup power circuits, power source control circuits, data storage devices, and methods relating to controlling application of power to a node are disclosed. An example power source includes an input, backup power source, and a backup power source control circuit. The input is configured to be coupled to a primary power source and further configured to couple the primary power source to the output when the input is coupled to the primary power source. The backup power source control circuit is configured to control a current path from the backup power source to the output based at least in part on a voltage applied to the input.

19 Claims, 3 Drawing Sheets

POWER SOURCE AND POWER SOURCE CONTROL CIRCUIT

CROSS-REFERENCE TO RELATED APPLICATION

This application is a continuation of U.S. patent application Ser. No. 13/619,536, filed Sep. 14, 2012, which application is a continuation of U.S. patent application Ser. No. 12/816,878, filed Jun. 16, 2010, issued as U.S. Pat. No. 8,289,799 issued on Oct. 16, 2012. These applications and patent are incorporated by reference herein in their entirety and for all purposes.

TECHNICAL FIELD

Embodiments of the invention relate generally to electrical circuits, and specifically, in one or more of the illustrated embodiments, to power source control circuits controlling provision of power from power sources to an output.

BACKGROUND OF THE INVENTION

In some systems there is a need to provide a secondary power source, for example, a capacitor or battery, that is used to power the system after primary power is removed, in order to allow for graceful cleanup of any data processing and/or data storage. Solid state drives (SSDs) with mapping and cached data stored in dynamic random access memory (DRAM) is such a system. When primary power is removed, the controllers on the SSDs need some time to migrate any required data safely from DRAM to the non-volatile memory storage.

The existing method to allow the logical "OR"ing of power sources is two parallel diodes, typically Schottky diodes, with a common cathode providing power to the circuit and each anode connected to a respective power source. FIG. 1 illustrates an example of such an arrangement. A primary power source 102 providing a VSUP voltage is coupled to an output node VOUT through diode 110 and a secondary power source 104 providing a VBACKUP voltage is coupled to the VOUT node through diode 112. A load, represented by resistance 106, is coupled to the VOUT node. In operation, the primary power source 102 provides power to the VOUT node by forward biasing the diode 110. The voltage at the VOUT node as driven by the primary power source 102 is sufficient to prevent the diode 112 from being forward biased. As a result, the secondary power source 104 does not provide power to the VOUT node. In response to the primary power source 102 no longer providing power to the VOUT node (e.g., the primary power source 102 is disconnected), the voltage of the VOUT node will decrease and cause the diode 112 to be forward biased. As a result, the secondary power source 104 provides power to the VOUT node instead of the primary power source 102. If the primary power source 102 again provides power (e.g., the primary power source 102 is reconnected), the diode 110 becomes forward biased so that the VSUP voltage is provided to the VOUT node and the diode 112 is no longer forward biased so that the secondary power source 104 is no longer providing power to the VOUT node.

A drawback of the configuration illustrated in FIG. 1 is the diodes 110, 112 waste power at a rate of about (0.4 V×I), where I is the current supplied to the system load. For example, for a system that draws two amps from a 12 Volt supply, the immediate loss power is about 0.8 Watts from the diodes, or 3% of the total power. For a 5V supply, the immediate loss is 8%. In power limited systems, the inefficiency detracts from the maximum power available for the system to operate, and decreases the maximum performance the system can provide. In addition to the performance issue, the loss in the diode is dissipated as heat which must be further dissipated from the system.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
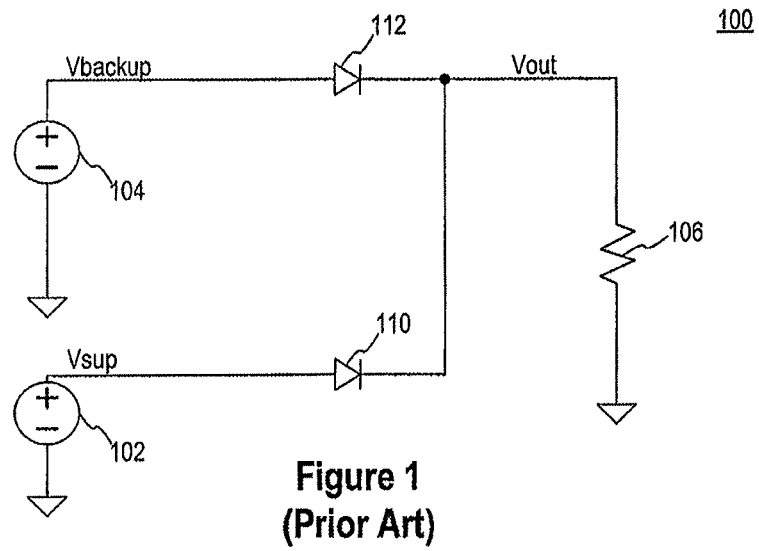
FIG. 1 is a schematic drawing of a conventional power source.
Figure 2:
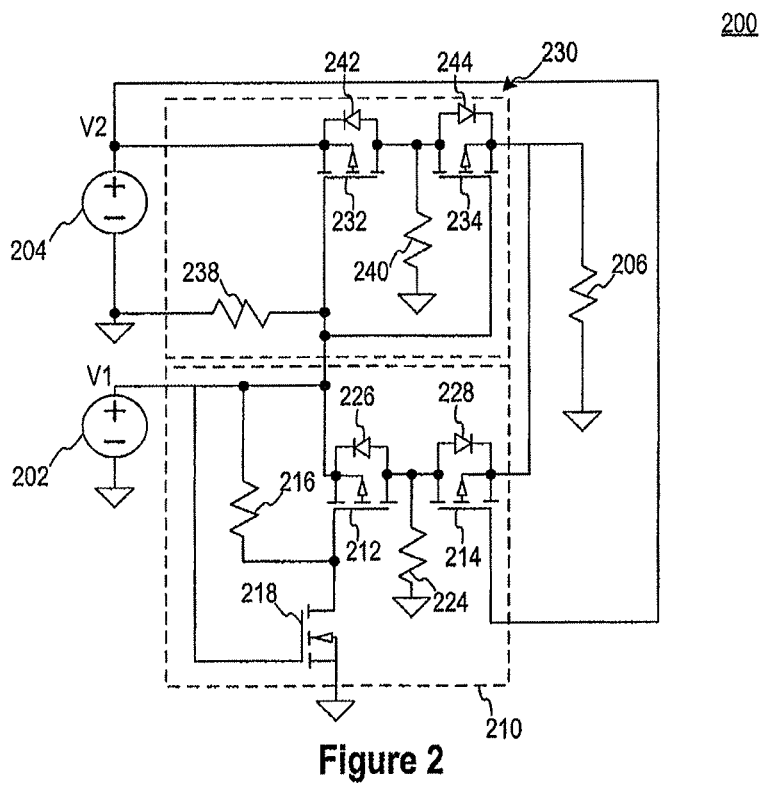
FIG. 2 is a schematic drawing of a power source according to an embodiment of the invention.

FIG. 2 illustrates a power source 200 according to an embodiment of the invention. The power source 200 includes a first power source 202 that provides a voltage V1 and a second power source 204 that provides a voltage V2. Coupled to the power sources 202 and 204 are respective power source control circuits 210 and 230. In some embodiments, the first power source 202 may represent a primary power source and the second power source 204 may represent a secondary (e.g., backup) power source. In some embodiments, the magnitude of the V1 voltage provided by the first power source 202 may be different than the magnitude of the V2 voltage provided by the second power source 204. In some embodiments, the second power source represents a power storage circuit, for example, a charged energy storage device, a capacitor, and/or battery. In some embodiments, the second power source represents an active energy device, a solar panel, and/or an environmental energy harvester.

As will be explained in greater detail below, the power source control circuits 210 and 230 control the application of the voltages provided by the first and second power sources to the output node VOUT. A resistance 206 coupled to the VOUT node represents a load to be driven by the power source 200.

In the embodiment illustrated in FIG. 2, the power source control circuit 210 includes transistors 212 and 214 coupled in series between the first power source 202 and the VOUT node to provide a current path from the first power source. Diodes 226 and 228 are also coupled between the first power source 202 and the VOUT node, and may be provided by inherent diodes of transistors 212 and 214, respectively. A gate of the transistor 212 is coupled through resistance 216 to the first power source 202, and is further coupled to a node at a reference voltage, such as ground, through transistor 218. The resistance 216 is used to pull-up a drain of transistor 218.

A gate of transistor 218 is coupled to the first power source 202. A resistance 224 is coupled to a common node between the transistors 212 and 214 to prevent the node from floating during operation, and a gate of the transistor 214 is coupled to the second power source 204.

The power source control circuit 230, as shown for the embodiment illustrated in FIG. 2, includes transistors 232 and 234 coupled in series between the second power source 204 and the VOUT node to provide a current path from the second power source. Diodes 242 and 244 are also coupled between the second power source 204 and the VOUT node, and may be provided by inherent diodes of transistors 232 and 234, respectively. Gates of transistors 232 and 234 are coupled to the first power source 202. A resistance 240 is coupled to a common node between transistors 232 and 234 to prevent the node from floating during operation. Resistance 238 is coupled to a reference voltage of the second power source and the gates of the transistors 232 and 234 and provides a relatively high-impedance connection to the reference voltage.

As shown for the embodiment of FIG. 2, the resistances 216, 224 of the power source control circuit 210 and resistances 238, 240 of the power source control circuit 230 are illustrated as resistors. In other embodiments, the resistances may be provided by alternative forms of resistances. Transistors 212 and 214 of the power source control circuit 210 and transistors 232 and 234 of the power source control circuit 230 are illustrated as p-channel field-effect transistors (p-FETs) and transistors 218 of the power source control circuit 210 is illustrated as an n-channel field-effect transistor (n-FET). Other transistors may be used in alternative embodiments, however.

In operation, assuming that both the first and second power sources 202, 204 are available to provide power, power is provided to the VOUT node to drive a load by the first power source 202. That is, the second power source 204 does not provide power to drive the load at the VOUT node under this condition. The V1 voltage causes the transistors 232 and 234 of the power source control circuit 230 to be non-conductive. The transistor 218, however, is made conductive by the V1 voltage. As a result, the gate of transistor 212 is coupled to ground through transistor 218 which causes transistor 212 to be conductive. Current provided by the first power source 202 through conductive transistor 212 is coupled through the diode 228 to develop a voltage at the VOUT node. Moreover, assuming that the V2 voltage is less than the V1 voltage by a voltage difference greater than a transistor threshold voltage for the transistor 214, the transistor 214 will be conductive and current from the first power source 202 will be provided to the VOUT node through transistor 214 as well.

Assuming in another example operation of the power source 200 that the first power source 202 ceases to provide power (e.g., the first power source 202 is disabled) and the second power source 204 is still available to provide power. During the transition from the first power source 202 providing V1 voltage to the second power source 204 providing the V2 voltage, as the V1 voltage drops below the V2 voltage to greater than a transistor threshold voltage of transistors 232 and 234, the transistors become conductive to couple the second power source to the VOUT node and provide a current path to drive the load. Additionally, as the V1 voltage drops below a transistor threshold voltage of transistor 218 it becomes non-conductive allowing the gate of transistor 212 to be at the same voltage as its source thereby causing transistor 212 to be non-conductive. Similarly, the gate-source voltage of transistor 214 becomes zero as transistor 212 becomes non-conductive because the VOUT node is driven by the second power source 204.

In another example operation of the power source 200, it is assumed that in addition to the first power source 202 ceasing to provide power, the reference voltage of the first power source 202, such as ground, is also unavailable, for example, the first power source 202 is disconnected. In such an event, the power source 200 operates as previously described for the example operation wherein the first power source 202 ceases to provide power but the second power source 204 is still available to provide the V2 voltage. Additionally, although the reference voltage of the first power source 202 is no longer available, the gates of transistors 232 and 234 are coupled to a reference voltage (e.g., ground) of the second power source 204 through resistance 238. As a result, a sufficient gate-source voltage is maintained for transistors 232 and 234 to continue to provide a current path from the second power source 204 to VOUT.

In another example operation of the power source 200, it is assumed that the second power source 204 is available to provide power and the first power source 202 becomes available to provide power (e.g., the first power source 202 is restored or reconnected). As the V1 voltage increases and exceeds the transistor threshold voltage of transistor 218, it becomes conductive to couple the gate of transistor 226 to the reference voltage thereby causing it to be conductive. Current provided by the first power source 202 through conductive transistor 212 is coupled through the diode 228 to develop a voltage at the VOUT node. As previously explained with reference to the example operation assuming that both the first and second power sources 202 and 204 are available to provide power, the transistor 214 becomes conductive as well so that a current path is provided between the first power source 202 and VOUT. Transistors 232 and 234 are non-conductive due to the V1 voltage applied to the respective gates.

Figure 3:
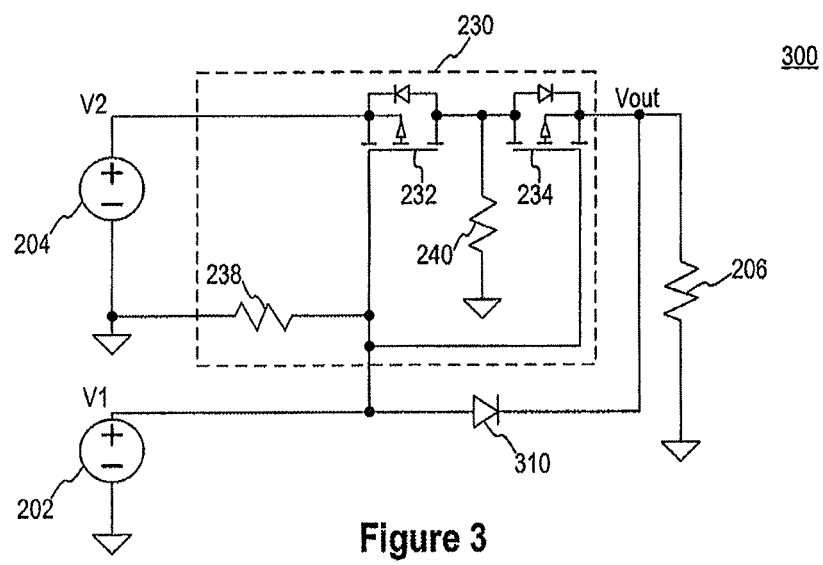
FIG. 3 is a schematic drawing of a power source according to an embodiment of the invention.

FIG. 3 illustrates a power source 300 according to an alternative embodiment of the invention. The power source 300 includes a first power source 202 and a second power source 204. The first power source 202 is coupled to a VOUT node through a conventional power source control circuit, such as a device (e.g. diode 310). A load, represented by resistance 206, is coupled to the VOUT node. The second power source 204 is coupled to the VOUT node through a power source control circuit 230. In some embodiments, the first power source 202 represents a primary power source and the second power source 204 represents a secondary (e.g., backup) power source. The embodiment illustrated in FIG. 3 may be used where the efficiency of the power path for the first power source is less of a concern than the efficiency of the power path for the second power source 204. In the embodiment of the power source 300 illustrated in FIG. 3, the power source control circuit is configured in a similar manner as the power source control circuit 230 previously described with reference to the embodiment illustrated in FIG. 2. It will be appreciated, however, that the power source control circuit of the power source 300 may be implemented using other configurations.

Operation of the power source 300 and more particularly, operation of the power source control circuit 230, is generally the same as previously described for the power source control circuit 230 illustrated in FIG. 2. In summary, in a situation where both the first and the second power sources 202 and 204 are available to provide power, power from the first power source is provided to the VOUT node to drive a load. Power from the second power source 204 is not provided to the VOUT node because transistors 232 and 234 are non-conductive due to the V1 voltage provided to their respective gates.

With transistors 232 and 234 non-conductive, the current path for the second power source 204 to the VOUT node is open.

If the first power source 202 becomes unavailable to provide power to the VOUT node (e.g., a primary voltage source disabled), a current path from the second power source 204 to the VOUT node is provided by the power source control circuit 230. That is, as the V1 voltage decreases, transistors 232 and 234 become conductive as a respective gate-source voltage exceeds the respective transistor threshold voltage. The diode 310 prevents a current path for the power supplied by the second power source 204 from being provided back to the first power source 202. If a reference voltage of the first power source 202 is also unavailable (e.g., a primary voltage source is disconnected), transistors 232 and 234 continue to be coupled through resistance 238 to a reference voltage of the second power source 204. As a result, a sufficient gate-source voltage for transistors 232 and 234 is maintained to remain conductive. Assuming that the first power source 202 becomes available while the second power source 204 is providing power to the VOUT node, the current path provided by the power source control circuit 230 is opened as the gate-source voltage of transistors 232 and 234 exceeds the respective transistor threshold voltages due to an increasing V1 voltage. With the current path open between the second power source 204 and the VOUT node, the first power source 202 provides power through the diode 310 to the VOUT node.

Figure 4:
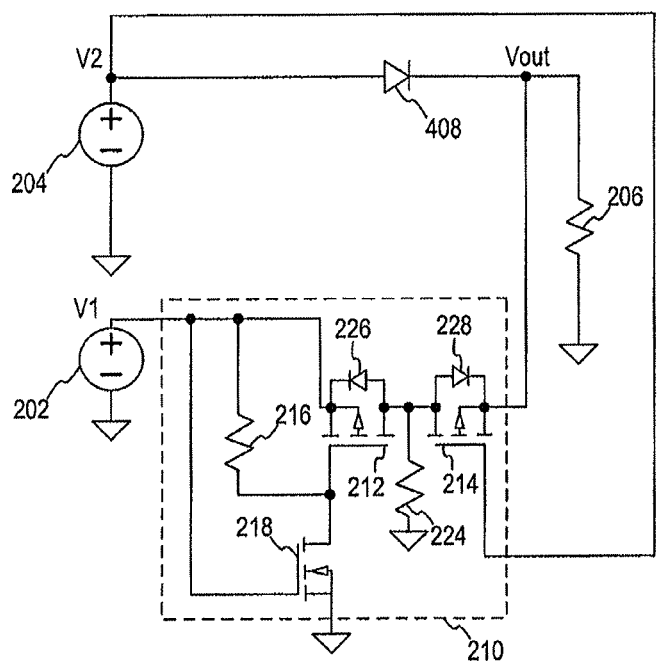
FIG. 4 is a schematic drawing of a power source according to an embodiment of the invention.

FIG. 4 illustrates a power source 400 according to an alternative embodiment of the invention. The power source 400 includes a first power source 202 and a second power source 204. The first power source 202 is coupled to the VOUT node through a power source control circuit 210. The second power source 204 is coupled to a VOUT node through a conventional power source control circuit, such as a device (e.g. diode 408). A load, represented by resistance 206, is coupled to the VOUT node. In some embodiments, the first power source 202 represents a primary power source and the second power source 204 represents a secondary (e.g., backup) power source. The embodiment illustrated in FIG. 4 may be used where the efficiency of the power path for the second power source 204 is less of a concern than the efficiency of the power path for the first power source 202. In the embodiment of the power source 400 illustrated in FIG. 4, the power source control circuit is configured in a similar manner as the power source control circuit 210 previously described with reference to the embodiment illustrated in FIG. 2. It will be appreciated, however, the power source control circuit of the power source 400 may be implemented using other configurations.

Operation of the power source 400 and more particularly, operation of the power source control circuit 210, is generally the same as previously described for the power source control circuit 210 illustrated in FIG. 2. In summary, in a situation where both the first and the second power sources 202 and 204 are available to provide power, power is provided to the VOUT node by the first power source 202. Power from the second power source 204 is not provided to the VOUT node because of diode 408. A current path is created for the first power source 202 through transistors 212 and 214 of the power source control circuit 210. That is, the V1 voltage causes transistor 218 to be conductive, coupling the gate of transistor 212 to the reference voltage (e.g., ground) to provide a gate-source voltage that exceeds the transistor voltage of transistor 212. As a result, current is provided through diode 228 of transistor 214 to the VOUT node. Additionally, where the difference between the V1 voltage of the first power source 202 and the V2 voltage of the second power source 204 exceeds a transistor voltage threshold of transistor 214, it will be conductive.

If the first power source 202 becomes unavailable to provide power to the VOUT node (e.g., a primary voltage source disabled), transistor 218 becomes non-conductive as the VOUT voltage decreases to allow the gate of transistor 212 to be at the same voltage as its source. As a result, transistor 212 becomes non-conductive. Similarly, the gate-source voltage of transistor 214 becomes zero as transistor 212 becomes non-conductive because the VOUT node is driven by the V2 voltage of the second power source 204. Assuming that the first power source 202 becomes available while the second power source 204 is providing power to the VOUT node, a current path for the first power source 202 is provided by the power source control circuit 210 through transistors 212 and 214 as the V1 voltage increases and causes transistor 218 to be conductive. The diode 408 prevents the second power source 204 from providing power to the VOUT node as the V1 voltage increases and the voltage across the diode 408 is less than a forward bias voltage.

In some embodiments, the second power source 204, and the power source control circuits 210, 230 are associated with a device to which the first power source 202 is coupled through a connector, for example, a USB flash drive that is coupled to a USB port through which power is provided (i.e., providing the first power source 202), or a storage device coupled to a SATA port through which power is provided. Generally, the first power source 202 may represent various types of power sources, for example, a power supply circuit, a battery, a capacitor, a detachable power source or a fixed power source.

Figure 5:
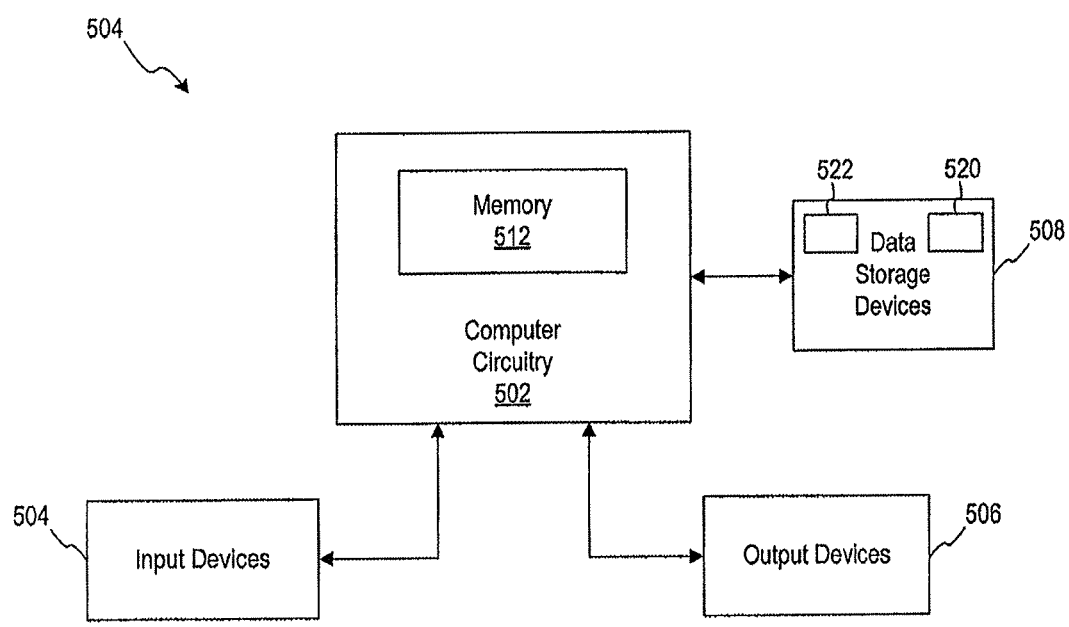
FIG. 5 is a block diagram of a processing system including a storage device having a power source according to an embodiment of the invention.

FIG. 5 illustrates a processor-based system 500, including computer circuitry 502 that contains memory 512. The computer circuitry 502 performs various computing functions, such as executing specific software to perform specific calculations or tasks. In addition, the processor-based system 500 includes one or more input devices 504, such as a keyboard, coupled to the computer circuitry 502 to allow an operator to interface with the processor-based system. Typically, the processor-based system 500 also includes one or more output devices 506 coupled to the computer circuitry 502, such output devices typically being a display device. One or more data storage devices 508 are also typically coupled to the computer circuitry 502 to store data to or retrieve data from a data storage medium 520, for example, non-volatile or persistent memory. The storage device 508 includes a power source control circuit 522 according to an embodiment of the invention, and may be coupled to receive power from the computer circuitry 502. Examples of storage devices 508 include disk memory, SSD, and non-volatile memory. The storage device 508 may be removable and coupled to the computer circuitry 502 through a port, for example, a USB port or a memory card port. Some examples of such storage devices 508 include USB flash drives, USB disk drives, and memory cards. Although shown in FIG. 5 as coupled to the computer circuitry 502, in some embodiments the data storage devices are included with the computer circuitry 502.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus comprising:
   a first control circuit configured to couple a first power source to an output; and a second control circuit configured to couple a second power source to the output, wherein the second control circuit includes a first transistor and a second transistor coupled in series between the output and the second power source, the second control Circuit further including a resistive element coupled to a node between the first transistor and the second transistor, and the resistive element further coupled to a ground node.

2. The apparatus of claim 1, wherein the first control circuit comprises a third transistor coupled in series with a fourth transistor.

3. The apparatus of claim 2, wherein the first control circuit comprises second resistive element coupled to a second node between the third transistor and the fourth transistor and the second resistive element further coupled to the ground node.

4. The apparatus of claim 2, wherein the first control circuit comprises a fifth transistor coupled between a gate of the third transistor and the ground node.

5. The apparatus of claim 1, wherein the second control circuit is configured to couple the second power source to the output responsive to the first power source being disabled.

6. The apparatus of claim 1, wherein the second control circuit is configured to decouple the second power source from the output responsive to the first power source being enabled.

7. The apparatus of claim 1, wherein a voltage of the first power source is greater than a voltage of the second power source.

8. The apparatus of claim 1, wherein the first control circuit comprises a diode coupled to the first power source and the output.

9. An apparatus, comprising:
a first transistor coupled to a first power source, wherein a gate of the first transistor is coupled to an input via a resistive element;
a second transistor coupled in series with the first transistor and to an output, wherein the first transistor and the second transistor are configured to couple the first power source to the output responsive to the first power source being enabled; and
a control circuit coupled to the output and to the first power source.

10. The apparatus of claim 9, further comprising a third transistor coupled between a gate of the first transistor and a ground node, 11. The apparatus of claim 10, wherein a gate of the third transistor is coupled to the input.

12. The apparatus of claim 9, wherein a gate of the second transistor is coupled to a second power source.

13. The apparatus of claim 9, wherein a resistive element is coupled to a node between the :first transistor and the second transistor and further coupled to a ground node.

14. A method, comprising:
enabling a first transistor and a second transistor responsive to a power source being enabled, wherein the first transistor is coupled in series with the second transistor;
disabling a control circuit responsive to the power source being enabled;
providing the power source to an output through the enabled first transistor and enabled second transistor; and
discharging a node between the first transistor anal the second transistor to a reference via a resistive element responsive to the power source being disabled.

15. The method of claim 14, further comprising a second power source to the output responsive to the power source being disabled.

16. The method of claim 14, wherein providing the second power source to the output responsive to the power source being disabled comprises enabling a second control circuit.

17. The method of claim 16, wherein enabling the second control circuit comprises enabling a third transistor and a fourth transistor.

18. The method of claim 16, further comprising receiving the second power source at an input of the second control circuit.

19. The method of claim 14, further comprising disabling the first transistor and the second transistor responsive to the power source being disabled.

* * * * *

UNITED STATES PATENT AND TRADEMARK OFFICE
CERTIFICATE OF CORRECTION

PATENT NO. : 8,804,451 B2  
APPLICATION NO. : 13/971643  
DATED : August 12, 2014  
INVENTOR(S) : Douglas Todd Hayen Page 1 of 1

It is certified that error appears in the above-identified patent and that said Letters Patent is hereby corrected as shown below:

In the Claims

Column 6, line 65, in Claim 1, delete "apparatus" and insert -- apparatus, --, therefor.

Column 7, line 5, in Claim 1, delete "Circuit" and insert -- circuit --, therefor.

Column 8, line 5, in Claim 10, delete "node," and insert -- node. --, therefor.

Column 8, line 11, in Claim 13, delete ":first" and insert -- first --, therefor.

Column 8, line 20, in Claim 14, delete "and" and insert -- and the --, therefor.

Column 8, line 22, in Claim 14, delete "anal" and insert -- and --, therefor.

Column 8, line 25, in Claim 15, delete "comprising" and insert -- comprising providing --, therefor.

Signed and Sealed this  
Fourth Day of November, 2014

Michelle K. Lee  
*Deputy Director of the United States Patent and Trademark Office*